(12) United States Patent
Shi et al.

(10) Patent No.: US 7,476,813 B2
(45) Date of Patent: Jan. 13, 2009

(54) MULTILAYER FLIP-CHIP SUBSTRATE INTERCONNECT LAYOUT

(75) Inventors: Hao Shi, Sunnyvale, CA (US); Xingchao Yuan, Palo Alto, CA (US)

(73) Assignee: Rambus inc., Los Altos, CA (US)

( * ) Notice: Subject to any disclaimer, the term of this patent is extended or adjusted under 35 U.S.C. 154(b) by 814 days.

(21) Appl. No.: 10/438,238

(22) Filed: May 14, 2003

(65) Prior Publication Data
US 2004/0229396 A1 Nov. 18, 2004

(51) Int. Cl.
*H01R 12/04* (2006.01)
*H05K 1/11* (2006.01)
(52) U.S. Cl. ...................... 174/262; 361/792
(58) Field of Classification Search ......... 174/261–266; 361/792–795
See application file for complete search history.

(56) References Cited

U.S. PATENT DOCUMENTS

| | | | | |
|---|---|---|---|---|
| 5,285,018 A | * | 2/1994 | Pence, IV | .................. 174/261 |
| 6,199,273 B1 | * | 3/2001 | Kubo et al. | .................... 29/843 |
| 6,323,439 B1 | * | 11/2001 | Kambe et al. | ............... 174/262 |
| 6,362,438 B1 | * | 3/2002 | Chong et al. | ................ 174/262 |
| 6,428,942 B1 | * | 8/2002 | Jiang et al. | ................... 430/312 |
| 6,495,770 B2 | * | 12/2002 | Li et al. | ...................... 174/255 |
| 6,591,495 B2 | * | 7/2003 | Hirose et al. | .................. 29/846 |
| 6,749,927 B2 | * | 6/2004 | Cooray | ........................ 428/209 |
| 6,847,527 B2 | * | 1/2005 | Sylvester et al. | ............ 361/763 |
| 2001/0029065 A1 | * | 10/2001 | Fischer et al. | ............... 438/115 |
| 2002/0033275 A1 | * | 3/2002 | Sumi et al. | ................... 174/262 |
| 2004/0231141 A1 | * | 11/2004 | Nishinaka et al. | ............. 29/609 |

* cited by examiner

*Primary Examiner*—Jeremy C Norris
(74) *Attorney, Agent, or Firm*—Morgan, Lewis & Bockius LLP

(57) ABSTRACT

The multilayer substrate includes a plurality of layers. Located within the plurality of layers are a number of vias. Conductive traces connect the vias to form trace/via paths having various topologies, geometries, and/or properties.

41 Claims, 6 Drawing Sheets

MULTILAYER FLIP-CHIP SUBSTRATE INTERCONNECT LAYOUT

TECHNICAL FIELD

This invention relates to interconnect structures in a multilayer substrate.

BACKGROUND OF THE INVENTION

Integrated circuit (IC) packages are enclosures that house integrated circuit (IC) dies. An IC die is typically a single square or rectangular piece of semiconductor material in which various microelectronic circuits have been formed. An IC package serves to both protect the IC die contained therein from physical and environmental damage and to physically and electrically connect the IC die to a printed circuit board (PCB). The term "IC package" is used herein to describe an IC package without the IC die connected therein. In contrast, the term "IC die package" is used herein to describe an IC package having an IC die connected therein.

In some IC die packages, the IC die is physically and electrically connected to a substrate within the IC package. The substrate is then, in turn, physically and electrically connected to the PCB using a ball grid array, a pin grid array, or various other mechanisms. When the substrate in the IC die package is composed of multiple layers of dielectric material, the IC die package is commonly referred to as a multilayer IC die package.

Multilayer IC die packages may be categorized according to the manner in which the IC die is connected to the substrate. Two such categories are wire bond type packages and flip-chip type packages. In a wire bond type IC die package, the IC die is placed or connected, top-side up, on the substrate and fine wires are used to connect contact pads on the top of the IC die to die pads on the top of the substrate. In contrast, in a flip-chip type package, the IC die is turned or flipped top-side down and the contact pads on the IC die are soldered directly to the die pads on the top of the substrate.

A substrate in a multilayer flip-chip type IC die package may include a number of upper die pads and lower solder pads. The substrate may also include a number of electrical interconnect paths, one disposed between each upper die pad and each lower solder pad. The interconnect paths are composed of electrically conductive signal traces ("traces") and electrically conductive vias. As such, the term "trace/via path" is used herein to denote this type of interconnection path through the substrate. In general, the traces in the trace/via path are disposed horizontally along or between the various substrate layers. In contrast, the vias in the trace/via path are disposed vertically through the various substrate layers.

Since the IC die is directly connected to the substrate in the multilayer flip-chip IC die package, without the use of wire bonds, the overall conductive signal path through which a signal travels between the IC die and the PCB is substantially shorter in the flip-chip type package than in the wire bond type package. This shorter overall signal path typically corresponds to significantly smaller inductance in the overall signal path in the flip-chip type package, as compared to the wire bond type package. As such, the flip-chip IC die package has generally been preferred to the wire bond IC die package in high-speed systems where lower inductance is generally preferred.

As the density of pin-counts in IC dies has increased, and as the overall form factor of flip-chip packages has decreased, the footprints of the trace/via paths within the substrate of the multilayer flip-chip IC die packages have generally been reduced, so that more interconnect paths may be fit side-by-side within the substrate. This reduction in the footprints of the trace/via paths is achieved, in part, by shortening the lengths of the various traces in the trace/via paths. This, in turn, further reduces the inductance of the overall signal paths in the flip-chip type package.

While lower inductance has, in the past, been thought to be only a benefit in multilayer flip-chip IC die packages, the inductance of the overall signal path may become so low that various signal transmission problems may arise. For example, as the inductance of the overall signal path decreases, the impedance of overall signal path also typically decreases. This is true, because the impedance (Zo) and inductance (L) are generally related as follows: $Zo = Sqrt[L/C]$, where C is the capacitance. If the inductance of the overall signal path is too low, the impedance of the overall signal path may no longer match the impedance of the IC and/or the PCB. When this occurs, signal transmission problems, such as signal reflections and reduced eye height, may occur. These problems may be particularly exacerbated in systems having very high signaling speeds, such as speeds on the order of multiple gigahertz. In these high-speed systems, even a small impedance mismatch may cause severe signaling problems.

SUMMARY OF THE INVENTION

Described herein are exemplary implementations of systems and methods related to or embodying various trace/via path topologies. In accordance with one embodiment, a substrate includes a number of dielectric layers. Located within each of the layers is an electrically conductive via. Electrically conductive traces interconnect the vias to form a single conductive trace/via path. In one implementation, each of the traces is located along one of two intersecting planes.

DETAILED DESCRIPTION

As previously noted, the overall footprints of interconnect topologies in multilayer flip-chip package substrates have been steadily decreasing to meet demands for smaller overall package form factors and to accommodate increasingly dense IC pin pitches. With this reduction has come the unexpected problem of exceedingly low inductances in the overall signal path of the multilayer flip-chip package. This low inductance has, in turn, been manifested in an undesirably low impedance in the overall signal path of the multilayer flip-chip package. This undesirably low impedance in overall signal path of the multilayer flip-chip package tends to cause undesirable impedance mismatches with the IC dies in the package and with the PCBs to which the packages are connected.

In general, various implementations described herein accomplish impedance tuning in a multilayer substrate by arranging or forming vias and traces in the trace/via paths of the substrate in a manner that achieves desired impedances. In this respect, a number of features or arrangements described herein may be applicable generally to multilayer substrates. More particularly, a number of features or arrangements described herein may be particularly applicable to multilayer flip-chip IC die packages. These various features and arrangements will now be described particularly with respect to the systems shown in FIGS. 1-6.

As will be described, each of FIGS. 1-6 illustrates a different view of an exemplary implementation of a multilayer flip-chip package. In particular, FIGS. 1-6 illustrate various implementations of systems and methods related to a multilayer flip-chip IC die packages having a unique "cross-stitched" interconnect/via topology. However, while various specific implementations are described, the scope of this patent is not intended to be limited to these various implementations. Rather, the inventors have contemplated that all or part of the various specific implementations described herein, or various features or concepts embodied within the described implementations, might also be embodied in whole or in part in other ways, to include different elements or operations, or combinations of elements or operations similar to the ones described in this document, in conjunction with other present or future technologies.

Figure 1:
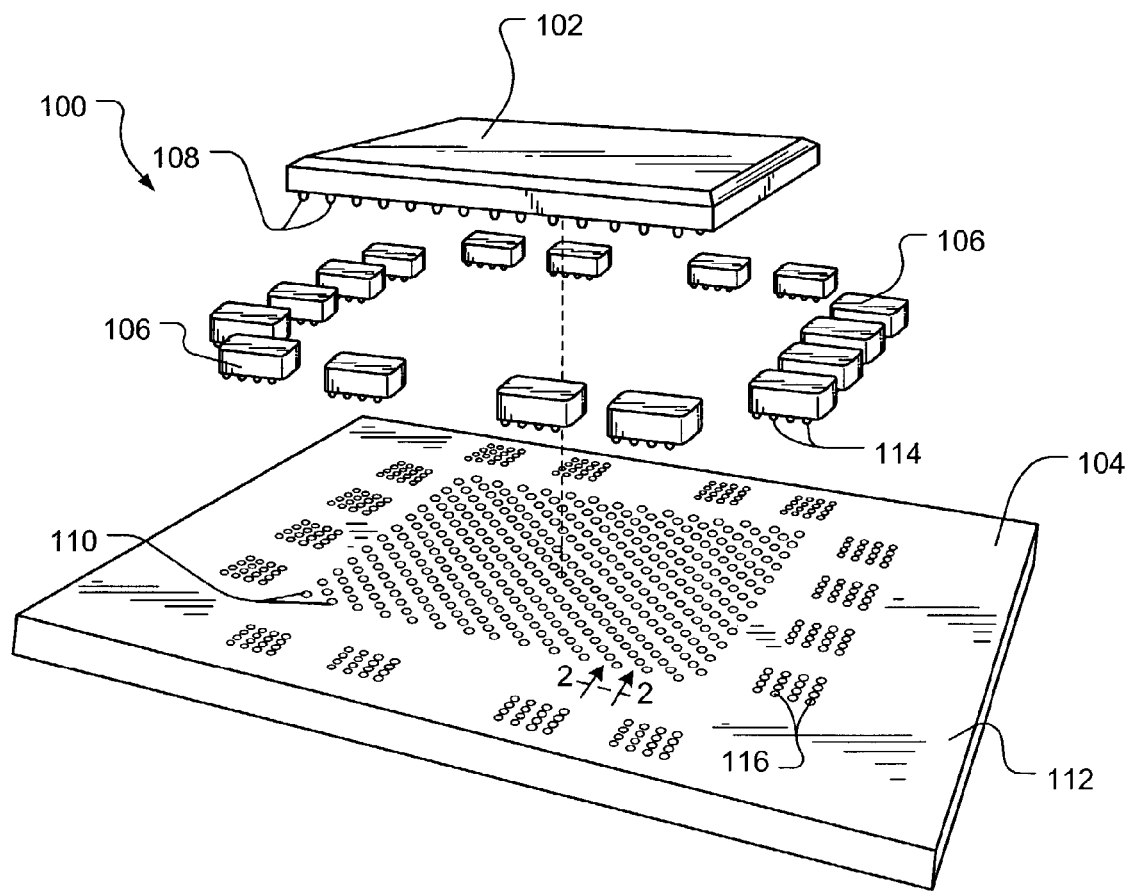
FIG. 1 illustrates one embodiment of a multiple layer flip-chip IC die package.

Turning now to FIG. 1, illustrated therein is an exploded view of an exemplary embodiment of a multilayer flip-chip IC die package ("flip-chip package") 100. Included in the flip-chip package 100 are an integrated circuit (IC) die 102, or other circuit element, a multilayer substrate ("substrate") 104, and various ancillary circuits 106, such as decoupling capacitors, and the like. The IC die 102 includes a number of solder bumps 108, each of which contacts an associated die pad 110 on a top surface 112 of the substrate 104 when the IC die 102 is mounted to the substrate 104. Similarly, each of the ancillary circuits 106 includes solder bumps 114 that contact associated die pads 116 on the substrate when the ancillary circuits 106 are connected to the substrate 104. The solder bumps 108 and 114 form an electrical and mechanical bond between the chip and the substrate.

Additionally, though not shown in FIG. 1, the flip-chip package 100 may include an underfill material between the IC die 102 and the substrate 104. The underfill material functions, among other ways, to adhesively bond the IC die 102 to substrate 104, to protect the IC die 102 from external contaminants, and to provide improved thermal performance of the flip-chip package.

Figure 2:
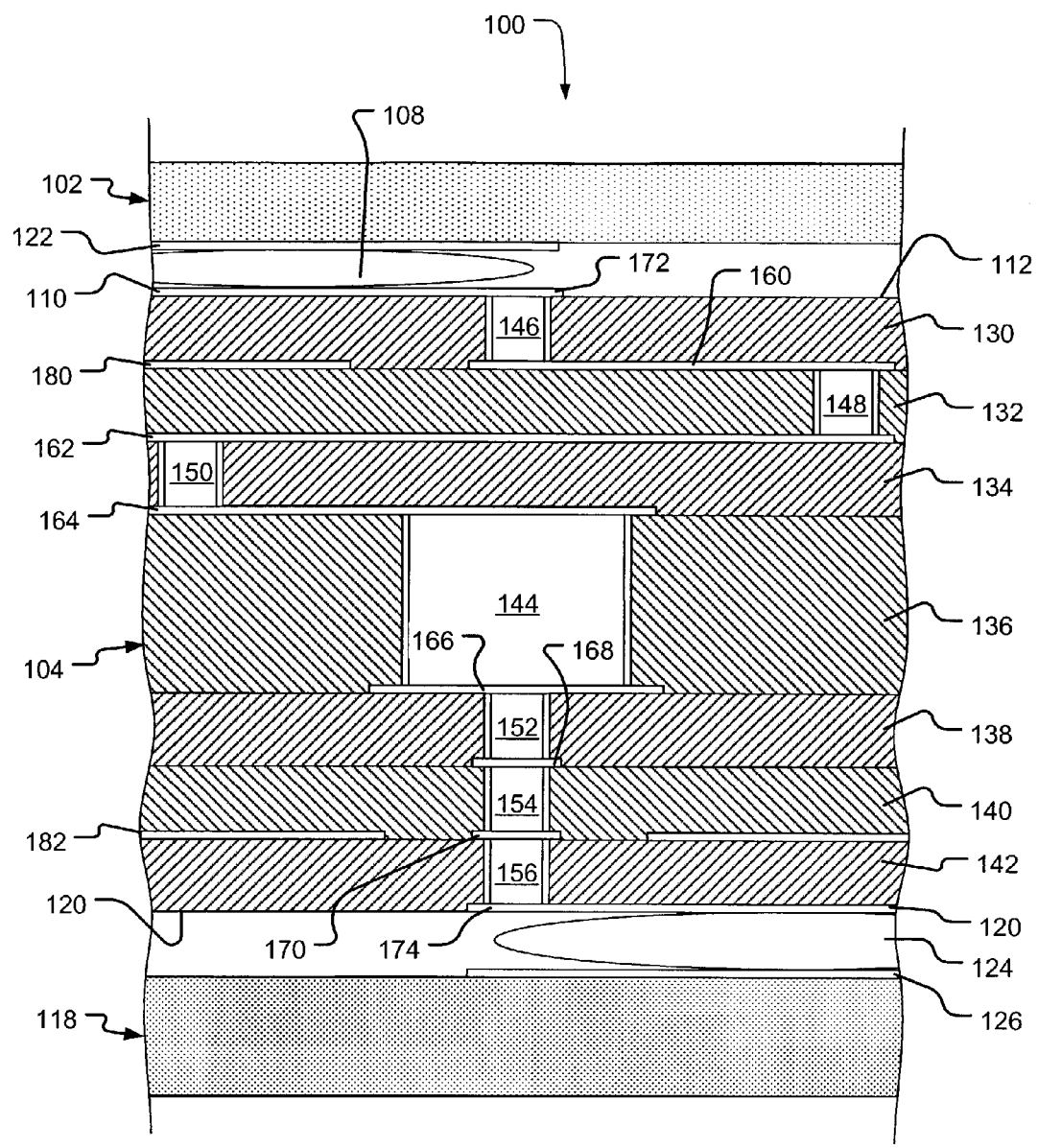
FIG. 2 is a partial cross-sectional view the flip-chip IC die package of FIG. 1 taken in the plane of line 2-2 and illustrating an exemplary via/trace path.

FIG. 2 shows a partial cross-sectional view of the flip-chip package 100 of FIG. 1. The view shown in FIG. 2 is taken along the plane 2-2 shown in FIG. 1, with the IC die 102 positioned on the substrate 104 and the flip-chip package 100 positioned on a printed circuit board (PCB) 118. The particular cross-sectional area of the flip-chip package shown in FIG. 2 illustrates an exemplary trace/via path 109, including a number of interconnected electrically conductive vias 144, 146, 148, 150, 152, 154, and 156, and traces 160, 162, 164, 166, 168, and 170, as described in detail below. As shown, the trace/via path 109 extends between a die pad 110 and a solder pad 120 of the substrate 104. It should be understood that the trace/via path 109 may be representative of any one or more, or all, of the trace/via paths of the substrate 104.

As shown in FIG. 2, the die pad 110 of the substrate 104 is physically and electrically connected to a contact pad 122 of the IC die 102 using a solder ball or bump 108. Similarly, a solder ball or bump 124 physically and electrically connects the solder pad 120 to a contact pad 126 on the PCB 118. These solder bumps 108 and 124 will typically be applied to the IC and the substrate, respectively, before the package 100 is assembled, in what is referred to as a bumping process.

The substrate 104 includes a number of adjoining dielectric layers. Specifically, in the embodiment shown, the substrate includes: three upper dielectric buildup layers 130, 132, and 134; a dielectric core layer 136; and three lower dielectric buildup layers 138, 140, and 142. It should be appreciated that other embodiments of the substrate 104 may include different numbers and arrangements of dielectric layers. Located within the upper buildup layers 130, 132, and 134 are micro-vias 146, 148, and 150, respectively. Located within the core layer 136 is core via 144. Located within the lower buildup layers 138, 140, and 142 are micro-vias 152, 154, and 156, respectively.

Figure 4:
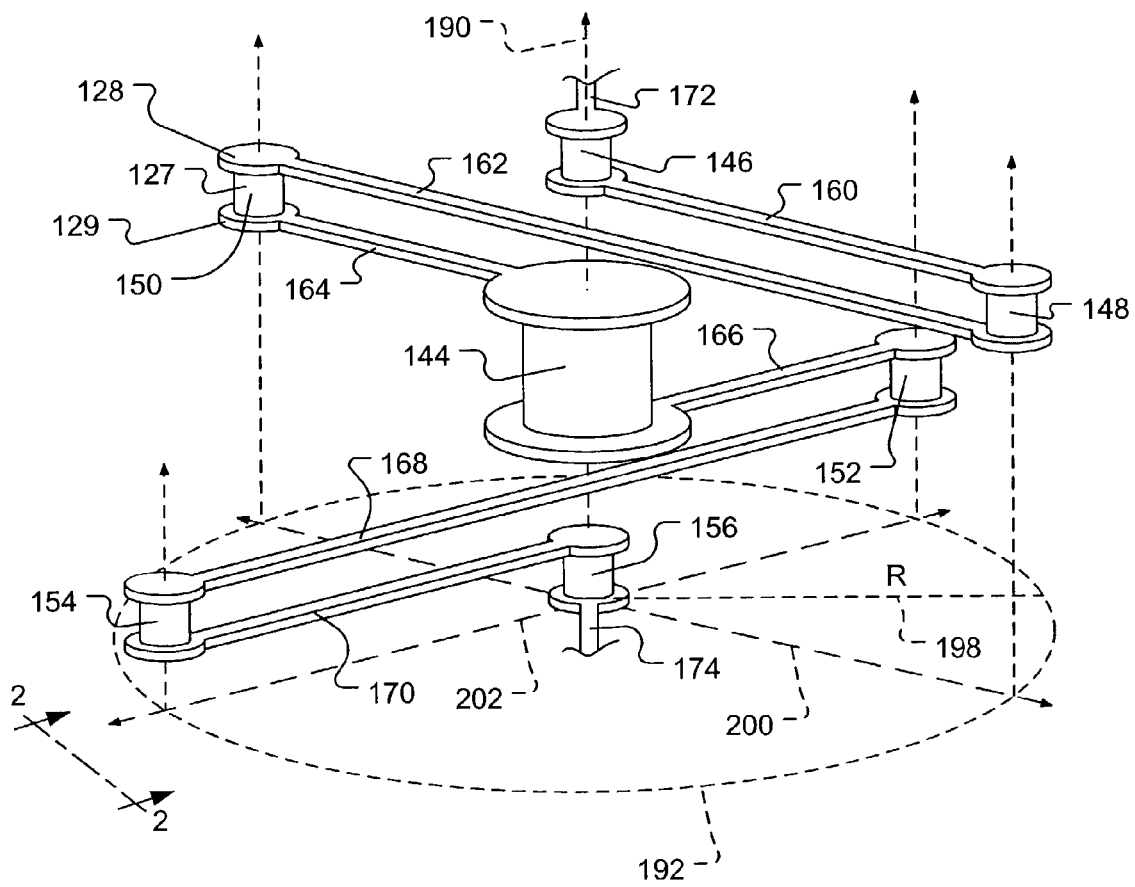
FIG. 4 is a perspective view of the trace/via path of FIG. 2.

In general, the core layer 136 serves as a relatively rigid structure upon which the various buildup layers are formed or connected. As such, the core layer will generally be significantly thicker than any of the buildup layers. The core layer 136 and the upper and lower buildup layers may be composed of various dielectric materials, having appropriate properties for use in multilayer substrates. With respect to the vias 144, 146, 148, 150, 152, 154, and 156, as shown, each via forms an electrically conductive path or connection through one of the substrate layers. As shown in FIG. 4, each via may include a central or drill portion 127, an upper pad 128, and a lower pad 129. The vias are formed in via holes that are fashioned or drilled in the substrate. The via holes may be fashioned using a number of techniques. For example, and without limitation, the vias holes may be fashioned using various mechanical drilling, laser drilling, or photolithographic techniques. However, given the relatively small diameters of the micro-vias, the via holes for the micro-vias will typically be made using either laser drilling, or photolithographic techniques.

After the via holes have been fashioned in the various layers, the vias are then formed in the via holes by depositing one or more electrically conductive materials, such as copper or the like, into the via holes. The electrically conductive material may fill the via holes completely, or the electrically conductive material may only line the via holes, leaving a hollow space in the electrically conductive material. In the case where the electrically conductive material only lines the via holes, the hollow space within the vias may be filled with various dielectric materials, or left hollow. The electrically conductive material may be applied or deposited in the via holes using a number of different methods. For example, the electrically conductive material may be deposited in the via holes using plating or paste filling, or a number of other techniques.

As previously noted, each of the vias in the via/trace path 109 is electrically connected to at least one other via in an adjoining dielectric layer by an electrically conductive trace ("trace") 160, 162, 164, 166, 168, 170, 172, and 174. The traces may be formed using photolithography, laser etching, or other methods. The traces may be composed of various electrically conductive materials, such as copper or the like.

With respect to the specific interconnections of the trace/via path 109, micro-via 146 is connected to micro-via 148 by trace 160; micro-via 148 is connected to micro-via 150 by trace 162; micro-via 150 is connected to core via 144 by trace 164; core via 144 is connected to micro-via 152 by trace 166; micro-via 152 is connected to micro-via 154 by trace 168; and micro-via 154 is connected to micro-via 156 by trace 170. Additionally, the uppermost micro-via 146 is connected to the substrate die pad 110 by trace 172, and the lowermost micro-via 156 is connected to the solder pad 118 of the substrate by trace 174.

In addition to the trace/via path 109, the substrate 104 may also contain various ground and/or power planes positioned on or between the dielectric layers. For example, as shown in FIG. 2, a ground or signal plane 180 is shown between dielectric layers 130 and 132. Likewise, a ground or signal plane 182 is shown between dielectric layers 140 and 142. When a via passes through but does not touch a plane, a distance, termed "keep-out distance" or "clearance", should be maintained.

Figure 3:
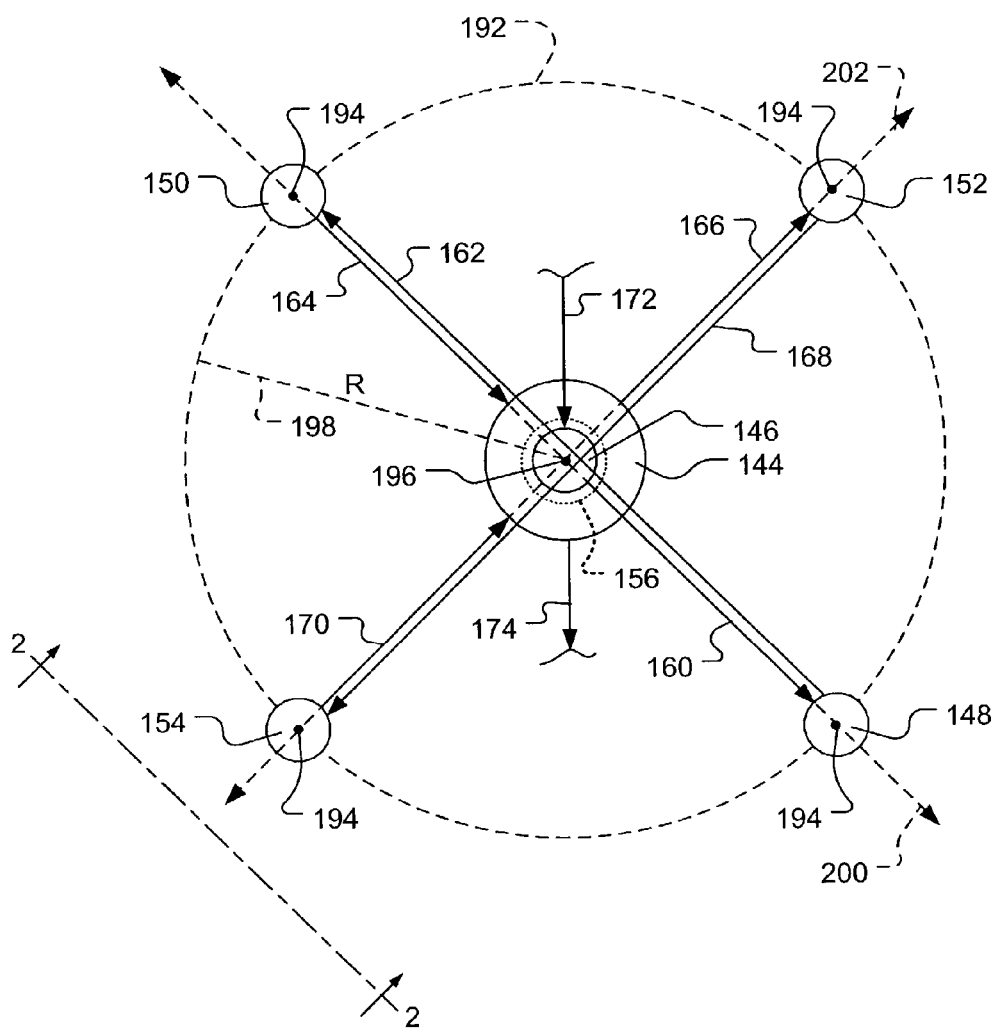
FIG. 3 is a top-plan view of the trace/via path of FIG. 2.

FIGS. 3 and 4 each illustrate different views or representations of the trace/via path 109. For example, FIG. 3 illustrates a top-plan view of the trace/via path 109, showing only the various vias and traces of the trace/via path 109. More particularly, FIG. 3 illustrates the spatial relationship, from a top down view, of the various vias of trace/via path 109. FIG. 4 illustrates a perspective view of the trace/via path 109, with the dielectric layers removed so that that the three dimensional structure of the trace/via path 109 can be more easily seen. The spatial relationship of the trace/via path 109 is shown in FIGS. 3 and 4 relative to the view of the trace/via path 109 shown in FIGS. 1 and 2, as identified by line 2-2 in FIGS. 1, 3, and 4.

As can be seen with reference to FIGS. 3 and 4, in this embodiment of the substrate 104, the uppermost micro-via 146 (the "entry via") in the trace/via path 109 is located directly above the core via 144. Additionally, the lowermost micro-via 156 (the "exit via") in the trace/via path 109 is located directly below the core via 144. Aligned as such, central points in each of the micro-vias 146 and 156 and the core via 144 may be said to define or be aligned with a vertical axis 190 (FIG. 4) that is generally normal to a plane defined by the upper and/or lower surfaces of the substrate 104 ("the plane of the substrate"). The alignment of the centers of the entry and exit vias with the center of the core via as described simplifies package layout design. For example, aligned as such, the top-down topology of the trace/via path can now be represented simply by a single circle for the foot-print of the whole via structure, instead of the typical "dog-bone shape" if the entry and exit vias do not coincide.

As can also be seen with reference to FIGS. 3 and 4, each of the remaining micro-vias 148, 150, 152, and 154 in the trace/via path 109 are positioned, relative to the plane of the substrate, along a generally circular path 192 centered at the vertical axis 190, and having a predefined radius R 198. Stated another way, each of the micro-vias 148, 150, 152, and 154 are positioned horizontally in the substrate 104, such that the center 194 of each of the micro-vias 148, 150, 152, and 154 is disposed at a distance R 198 from the center 196 of the core via 144.

As shown in FIGS. 3 and 4, the traces that connect the various vias in the trace/via path 109 are connected in what is referred to herein as a "cross-stitched" manner or pattern. In accordance with one embodiment of this cross-stitched pattern, each of the traces 160, 162, and 164 in or on the three upper buildup layers 130, 132, and 134 are disposed along a first plane 200 extending generally vertically through the substrate 104, and passing through the vertical axis 190. In accordance with this embodiment of the cross-stitched pattern, each of the traces 166, 168, and 170 in or on the lower buildup layers 138, 140, and 142 are disposed along a second plane 202 extending generally vertically through the substrate 104, and passing thorough the vertical axis 190. As shown in FIG. 3, each of the planes 200 and 202, are aligned perpendicular to one another. Furthermore, the planes 200 and 202 intersect along the vertical axis 190. As such, each of the traces 160, 162, and 164 in the upper buildup layers 130, 132, and 134 lie in a plane that is perpendicular to a plane in which each of the traces 166, 168, and 170 in the lower buildup layers 138, 140, and 142 lie.

The various topological features of the trace/via path 109 thus far described have been shown to be particularly effective and useful in designing trace/via paths having increased impedances, while maintaining relatively small trace/via footprints. As will be appreciated, since the lengths of each of the traces in the trace via/path 109 will be increased with an increase of radius R 198, the combined lengths of the traces in the trace/via path 109 may be greatly increased with only a small, and topologically simple, increase in the radius R 198. Thus, a significant increase in trace/via impedance may be made, without significantly increasing the footprint of the trace/via path 109. Likewise, a significant decrease in trace/via impedance may be made, without significantly decreasing the footprint of the trace/via path 109. As such, the impedance of the trace/via path may be "tuned" in the design process by simply adjusting the radius R, without requiring complicated design rules.

Having generally described the substrate 104 and the trace/via path 109, various parameters will now be described for constructing a substrate including a model "50 ohm" trace/via path, which conforms topologically with the trace/via path 109. The model 50 ohm trace/via path that will now be described achieves an overall impedance of approximately 50 ohms, while still maintaining a relatively narrow trace/via path topology. As will be appreciated by those skilled in the art, the impedance of a typical IC and of a typical PCB is approximately 50 ohms. As such, use of the model 50 ohm trace/via path is particularly useful in a multilayer flip-chip IC die package. The desirability of the model 50 ohm trace/via path 509 is further enhanced, as it may be manufactured using standard substrate manufacturing processes and materials.

Figure 5:
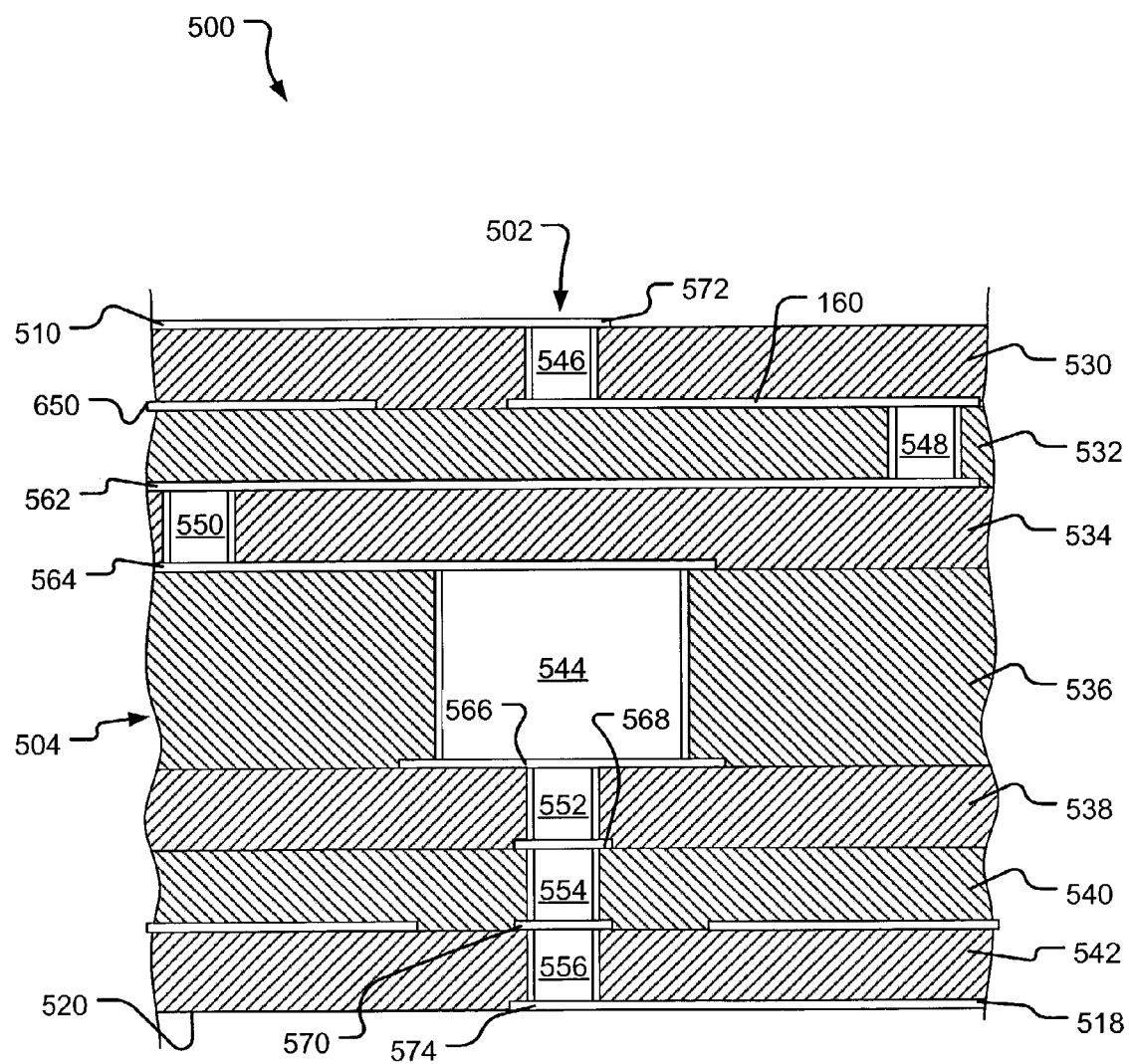
FIG. 5 is a partial cross-sectional view the flip-chip IC die package of FIG. 1 taken in the plane of line 2-2 and illustrating another embodiment of the via/trace path.
Figure 6:
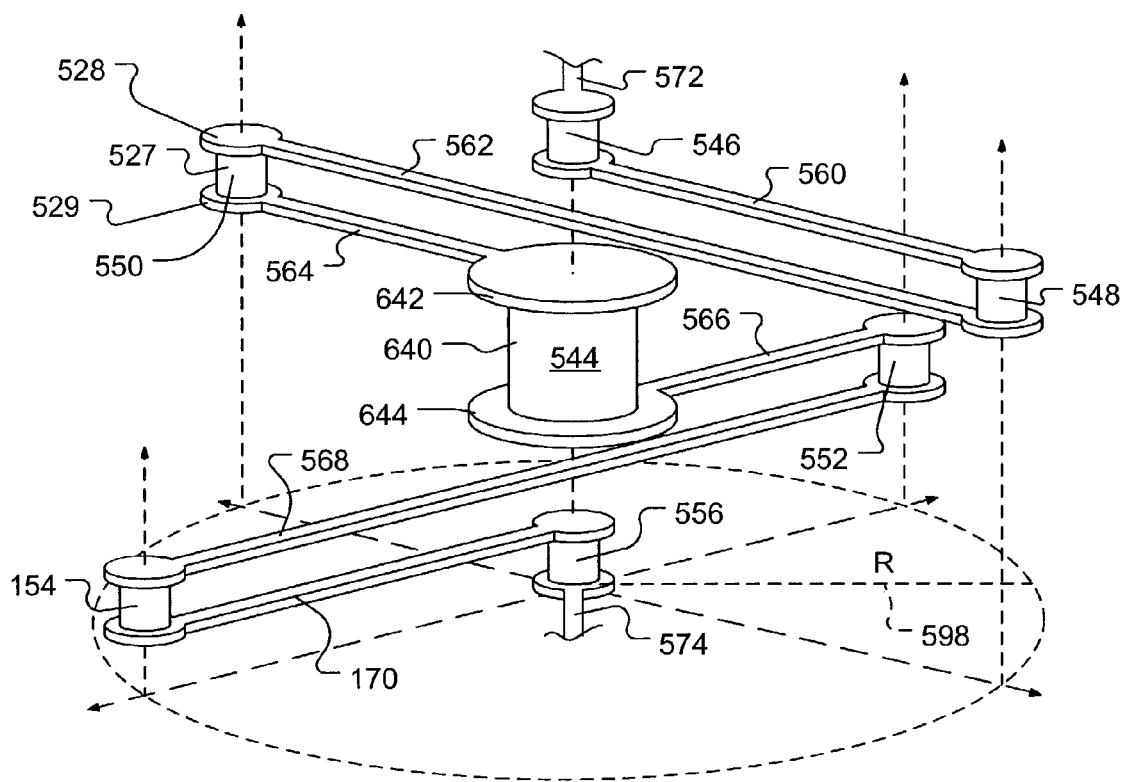
FIG. 6 is a perspective view of the trace/via path of FIG. 5.

FIG. 5 illustrates a cross-sectional view of a substrate 500 including an embodiment of the model 50 ohm trace/via path 509. Additionally, FIG. 6 illustrates a perspective view of the model 50 ohm trace/via path 509, with the dielectric layers removed. As shown in FIGS. 5 and 6, the substrate 500 and the model 50 ohm trace/via path 509 have the same general layout and topology as the substrate 104 and the trace/via path 109 shown above in FIGS. 2-4.

The substrate 500 includes three upper buildup layers 530, 532, and 534; a core layer 536; and three lower buildup layers 538, 540, and 542. In accordance with this embodiment, each of the upper and lower buildup layers has an average thickness from between about 30 μm to 40 μm. Additionally, each of the upper and lower buildup layers is composed of a dielectric material having a relative permittivity from between about 3.4 to 3.8 ($\in_r$=3.4 to 3.8) and a dielectric loss tangent of from between about 0.015 to 0.025 (tan δ=0.015 to 0.025). In accordance with this embodiment, the core layer 544 has an average thickness from between about 600 to 800 μm. Additionally, the core layer 544 is composed of a dielectric material having a relative permittivity from between about 4.3 to 4.7 ($\in_r$=4.3 to 4.7) and a dielectric loss tangent from between about 0.008 and 0.020 (tan δ=0.008 to 0.020).

Disposed within the upper buildup layers 530, 532, and 534 are electrically conductive micro-vias 546, 548, and 550, respectively. Formed within the core layer 536 is an electrically conductive core via 544. Disposed within the lower buildup layers 538, 540, and 542 are electrically conductive micro-vias 552, 554, and 556, respectively.

In accordance with this embodiment of the model 50 ohm trace/via path 509, the main body or drill portions of each of the micro-vias 527 and the drill portion 640 of the core via are all substantially cylindrical. Additionally, the upper 528 and lower 529 pads of the micro-vias and the upper 642 and lower 644 pads of the core via 544 are also substantially cylindrical. Likewise, the solder pad 518 and the die pad 510 are also cylindrical.

In accordance with this embodiment of the model 50 ohm trace/via path 502, the diameters of the drill portions of each micro-via and the core vias, and the upper and lower pads of each of the micro-vias and the core via, are all proportional to the diameter of the drill portion 640 of the core via 544 ("core via drill diameter"). Additionally, the diameter of the solder pad 518, and the width of each of the traces in the model 50 ohm trace/via path are all proportional to the core via drill diameter. Also, the distance of the radius 598, that is, the distance between the center of the core via and the centers of each of the micro-vias, is proportional to the core via drill diameter.

In accordance with one implementation of the model 50 ohm trace/via path, various via dimensions may be related as follows. The core via drill diameter may be from between about 150 µm to 250 µm. More particularly, the core via drill diameter may be approximately 250 µm. The diameter of the upper and lower pads of the core via may be from between about 2 and 3 times the core via drill diameter. More particularly, the diameter of the upper and lower pads of the core via may be approximately two times the core drill diameter. The diameter of the drill portions of the micro-vias (micro-via drill diameter) may be between from between about 0.18 to 0.22 times the core via drill diameter. More particularly, the micro-via drill diameter may be approximately one-fifth the core via drill diameter. The diameter of the upper and lower pad portions of the micro-vias may be from between about 2 to 3 times the micro-via drill diameter. More particularly, the diameter of the upper and lower pad portions of the micro-vias may be approximately twice the micro-via drill diameter.

Further in accordance with this embodiment of the model 50 ohm trace/via path, the diameter of the solder pad may be between from between about 2.7 to 2.8 times the core via drill diameter. The width of each of the traces in the model 50 ohm trace/via path may be from between about 0.12 to 0.16 times the core via drill diameter, where the width is the distance across a trace along the plane of the substrate.

Finally, in accordance with one implementation of the model 50 ohm trace/via path, the distance between the center of each micro-vias and the center of the core via (radius 598) may be from between about 1.1 to 1.3 times the core via drill diameter. More particularly, the distance between the center of each micro-vias and the center of the core via may be approximately 1.2 times the core via drill diameter.

The preceding description sets forth various implementations and embodiments. The implementations and embodiments described incorporate various elements and/or operations recited in the appended claims. The implementations and embodiments are described with specificity in order to meet statutory requirements. However, the description itself is not intended to limit the scope of this patent. Rather, the inventors have contemplated that the claimed invention might also be implemented in other ways, to include different elements and/or operations or combinations of elements and/or operations similar to the ones described in this document, in conjunction with other present or future technologies.

The invention claimed is:

1. A substrate comprising:
   a core layer;
   at least two buildup layers on one side of the core layer, and at least one buildup layer on an opposing side of the core layer;
   a core via positioned within the core layer along an axis;
   a plurality of distinct and separated micro-vias each positioned within a different one of the buildup layers, where each micro-via has a diameter substantially smaller than a diameter of the core via;
   a plurality of traces electrically interconnecting each of the micro-vias and the core via to form an electrically conductive path having an impedance substantially matching a target impedance, wherein the plurality of traces include:
      at least two traces on the first side of the core layer and positioned along a first plane that intersects with the axis; and
      at least one trace on the second side of the core layer and positioned along a second plane that intersects with the axis, wherein the second plane is distinct from the first plane.

2. A substrate as recited in claim 1, wherein each of the plurality of micro-vias is positioned at a distance R from the axis.

3. A substrate as recited in claim 2, wherein:
   the core via includes a substantially cylindrical portion having a core diameter; and
   the distance R is approximately 1.1 to 1.3 times the core diameter.

4. A substrate as recited in claim 2, wherein:
   the core via includes a substantially cylindrical portion having a core diameter; and
   the distance R is approximately 1.2 times the core diameter.

5. A substrate as recited in claim 2, wherein:
   the core via includes a substantially cylindrical portion having a core diameter of approximately 250 micrometers; and
   each micro-via includes a substantially cylindrical portion having a diameter that is approximately one-fifth the core diameter; and the distance R is approximately 1.2 times the core diameter.

6. A substrate as recited in claim 2, wherein:
   the core layer has a thickness of between approximately 600 and 800 micrometers and each buildup dielectric layer has a thickness between approximately 30 and 40 micrometers; and
   each of the plurality of traces resides substantially along one of two planes that intersect along the axis;
   the core via includes a substantially cylindrical portion having a core diameter; and
   the distance R is approximately 1.2 times the core diameter.

7. A substrate as recited in claim 1, wherein the two planes are generally perpendicular to one another.

8. A substrate as recited in claim 1, wherein:
   the substrate has an upper surface; and
   the system further comprises an entry micro-via electrically connected to the electrically conductive path and positioned within the substrate along the axis adjacent the upper surface.

9. A substrate as recited in claim 1, wherein:
   the substrate has upper and a lower surfaces;
   the system further includes entry and exit micro-vias positioned within the substrate along the axis and electrically connected to the electrically conductive path;
   the entry micro-via is positioned adjacent the upper surface of the substrate; and
   the exit micro-via is positioned adjacent the lower surface of the substrate.

10. A substrate as recited in claim 1, wherein:
the buildup layers comprise three upper buildup layers and three lower buildup layers; and
the core layer resides between the upper and lower buildup layers.

11. A substrate as recited in claim 1, wherein:
the core via includes a substantially cylindrical portion having a core diameter; and
each of the micro-vias includes a substantially cylindrical portion having a diameter that is approximately 0.18 to 0.22 times the core diameter.

12. A substrate as recited in claim 1, wherein:
the core via includes a substantially cylindrical portion having a core diameter; and
each of the micro-vias includes a substantially cylindrical portion having a diameter that is approximately one-fifth the core diameter.

13. A substrate as recited in claim 1, wherein the core via includes a substantially cylindrical drill portion having a core drill diameter and a substantially cylindrical upper pad portion having a diameter approximately 2 to 3 times the core drill diameter.

14. A substrate as recited in claim 1, wherein the core via includes a substantially cylindrical drill portion having a core drill diameter and a substantially cylindrical upper pad portion having a diameter approximately twice the diameter of the core drill portion.

15. A substrate as recited in claim 1, wherein:
each of the micro-vias includes a substantially cylindrical drill portion and a substantially cylindrical upper pad portion; and
a diameter of the upper pad portion of each micro-via is approximately 2 to 3 times a diameter of the drill portion of the micro-via.

16. A substrate as recited in claim 1, wherein:
each of the micro-vias includes a substantially cylindrical drill portion and a substantially cylindrical upper pad portion; and
a diameter of the upper pad portion of each micro-via is approximately twice the diameter of a drill portion of the micro-via.

17. A substrate as recited in claim 1, wherein:
the core via includes a substantially cylindrical portion having a core diameter; and
each of the traces has a trace width that is between 0.12 and 0.16 times the core diameter.

18. A substrate as recited in claim 1, wherein the core layer has a thickness of between approximately 600 and 800 micrometers.

19. A substrate as recited in claim 1, wherein each buildup layer has a thickness of between approximately 30 and 40 micrometers.

20. A substrate as recited in claim 1, wherein the core layer has a thickness of between approximately 600 and 800 micrometers and each buildup layer has a thickness of between approximately 30 and 40 micrometers.

21. A substrate as recited in claim 1, wherein:
the core layer has a thickness between approximately 600 and 800 micrometers and each buildup layer has a thickness between approximately 30 and 40 micrometers; and
each of the plurality of traces resides substantially along one of two planes that intersect along the axis.

22. A substrate as recited in claim 1, wherein each of the buildup layers has a relative permittivity between approximately 3.4 and 3.8, inclusive.

23. A substrate as recited in claim 1, wherein each of the buildup layers has a relative permittivity of approximately 3.4 to 3.8 and a dielectric loss tangent of approximately 0.015 to 0.025.

24. A substrate as recited in claim 1, wherein the core layer has a relative permittivity between approximately 4.3 and 4.7, inclusive.

25. A substrate as recited in claim 1, wherein the core layer has a relative permittivity of approximately 4.3 to 4.7 and a dielectric loss tangent of approximately 0.00 8 to 0.020.

26. A substrate as recited in claim 1, wherein the plurality of micro-vias include at least 4 micro-vias each positioned along one of the two planes that intersect along the axis.

27. A multilayer substrate comprising:
a first dielectric layer having a first via positioned therein along an axis, the axis defining an intersection of first and second substantially perpendicular planes;
a second dielectric layer having a second via positioned therein;
a third dielectric layer having a third via positioned therein;
a first trace positioned substantially along the first plane and electrically connecting the first via to the second via;
a second trace positioned substantially along the second plane and electrically connecting the first via to the third via;
a fourth dielectric layer adjacent the second dielectric layer, the fourth dielectric layer having a fourth via positioned therein; and
a third trace positioned substantially along the first plane and electrically connecting the second via to the fourth via, wherein an electrically conductive path that includes the vias and traces has an impedance substantially matching a target impedance.

28. A multilayer substrate as defined in claim 27, wherein the second and fourth vias are positioned along the first plane on opposite sides of the axis.

29. A multilayer substrate as defined in claim 28, wherein the second and fourth vias are positioned at a distance R from the axis.

30. A multilayer substrate as defined in claim 29, further comprising:
a fifth dielectric layer having a fifth via positioned therein; and
a fourth trace positioned substantially along the first plane and electrically connecting the fourth via to the fifth via.

31. A multilayer substrate as defined in claim 30, wherein the fifth via is positioned along the first plane on the axis.

32. A multilayer substrate as defined in claim 31, wherein the first via is a core via and the second, fourth, and fifth vias are each micro-vias.

33. A multilayer substrate as defined in claim 27, wherein the first dielectric layer is a core layer and the second layer is a buildup layer.

34. A multilayer substrate as defined in claim 27, wherein the first via is a core via and the second via is a micro-via that has a diameter substantially smaller than that of the core via.

35. A multilayer substrate comprising:
a first dielectric layer having a planar surface;
a first via positioned within the first dielectric layer along an axis perpendicular to the planar surface of the first dielectric layer;
a first trace electrically connected to an end of the first via along a first plane that intersects the axis;
a second trace electrically connected to an opposite end of the first via along a second plane that also intersects the axis, wherein a combination of the first trace, second trace, and first via form part of an electrically conductive path having an impedance that substantially matches an impedance of a target electrically connected to the substrate;

a second via in a second dielectric layer, wherein the second via is electrically connected to an end of the first trace opposite the first via; and a third trace electrically connected to the second via and positioned along the first plane, wherein the first plane is distinct to the second plane.

36. A substrate as recited in claim 35, where the first and second planes are generally perpendicular to one another.

37. The multilayer substrate of claim 35, further comprising a third via in a third dielectric layer, wherein the third via is electrically connected to an end of the third trace opposite the second via.

38. The multilayer substrate of claim 37, further comprising a fourth trace electrically connected to the third via and positioned along the first plane.

39. The multilayer substrate of claim 38, further comprising:

a fourth via in a fourth dielectric layer, wherein the fourth via is electrically connected to an end of the second trace opposite the first via;

a fifth trace electrically connected to the fourth via and positioned along the second plane;

a fifth via in a fifth dielectric layer, wherein the fifth via is electrically connected to an end of the fifth trace opposite the fourth via; and a sixth trace electrically connected to the fifth via and positioned along the second plane.

40. A multilayer substrate as recited in claim 38, wherein the vias are positioned at a distance R from the axis.

41. A multilayer substrate as recited in 38, wherein the first via is a core via, the core via including a substantially cylindrical portion having a core diameter; and the second and third vias are micro-vias, each micro-via including a substantially cylindrical portion having a diameter that is approximately 0.18 to 0.22 times the core diameter.

* * * * *